(12) United States Patent
Tutuc et al.

(10) Patent No.: US 11,894,445 B2
(45) Date of Patent: Feb. 6, 2024

(54) METHOD FOR PRODUCING A SUPERJUNCTION DEVICE

(71) Applicant: Infineon Technologies Austria AG, Villach (AT)

(72) Inventors: Daniel Tutuc, St. Niklas an der Drau (AT); Matthias Kuenle, Villach (AT); Ingo Muri, Villach (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/393,779

(22) Filed: Aug. 4, 2021

(65) Prior Publication Data
US 2022/0052182 A1 Feb. 17, 2022

(51) Int. Cl.
*H01L 29/66* (2006.01)
*H01L 21/265* (2006.01)
(Continued)

(52) U.S. Cl.
CPC .. *H01L 29/66712* (2013.01); *H01L 21/26586* (2013.01); *H01L 21/823487* (2013.01); *H01L 29/0634* (2013.01); *H01L 29/0878* (2013.01); *H01L 29/66666* (2013.01); *H01L 29/66727* (2013.01); *H01L 29/7802* (2013.01)

(58) Field of Classification Search
CPC ........... H01L 29/66712; H01L 29/7802; H01L 29/66666; H01L 29/0634; H01L 21/26586
See application file for complete search history.

(56) References Cited

U.S. PATENT DOCUMENTS

| 5,968,279 A  * | 10/1999 | MacLeish ......... H01L 21/67028 |
| | | 438/719 |
| 6,780,250 B2 * | 8/2004 | Pas .................... H01L 21/67196 |
| | | 156/345.31 |
| 2018/0019132 A1* | 1/2018 | Mauder ............. H01L 29/66712 |

FOREIGN PATENT DOCUMENTS

| JP | 2009141307 A  * | 6/2009 | ........... H01L 21/263 |
| JP | 2009141307 A | 6/2009 | |

(Continued)

OTHER PUBLICATIONS

JP2009513024, with translation (Patent family of WO2007/048393A2) (Year: 2022).*
JP 2009/141307, with translation (Year: 2022).*

*Primary Examiner* — Bilkis Jahan
*Assistant Examiner* — Victor V Barzykin
(74) *Attorney, Agent, or Firm* — Murphy, Bilak & Homiller, PLLC

(57) ABSTRACT

Disclosed is a method for producing a semiconductor device, the method including forming a plurality of semiconductor arrangements one above the other, wherein forming each of the plurality of semiconductor arrangements includes forming a semiconductor layer, forming a plurality of trenches in a first surface of the semiconductor layer, and implanting dopant atoms of at least one of a first type and a second type into at least one of a first sidewall and a second sidewall of each of the plurality of trenches. Forming of at least one of the plurality of semiconductor arrangements further includes forming a protective layer covering mesa regions between the plurality of trenches of the respective semiconductor layer, and covering a bottom, the first sidewall and the second sidewall of each of the plurality of trenches that are formed in the respective semiconductor layer.

14 Claims, 8 Drawing Sheets

(51) Int. Cl.
*H01L 29/06* (2006.01)
*H01L 29/08* (2006.01)
*H01L 29/78* (2006.01)
*H01L 21/8234* (2006.01)

(56) References Cited

FOREIGN PATENT DOCUMENTS

| | | | |
|---|---|---|---|
| WO | 2007048393 | A2 | 5/2007 |
| WO | 2007048393 | A3 | 9/2007 |

\* cited by examiner

METHOD FOR PRODUCING A SUPERJUNCTION DEVICE

TECHNICAL FIELD

This disclosure in general relates to a method for producing a superjunction device, in particular for producing a drift region with n-type regions and p-type regions in a superjunction device.

BACKGROUND

A superjunction device, which often is also referred to as compensation device, includes a drift region with at least one region of a first doping type (first conductivity type) and at least one region of a second doping type (second conductivity type) complementary to the first doping type. The at least one region of the first doping type may also be referred to as drift region and the at least one region of the second doping type may also be referred to as compensation region.

A superjunction device can be operated in an on-state and an off-state. The on-state is an operation mode in which a current can flow in a current flow direction through the first doping type region. The off-state is an operation mode in which a pn-junction between the at least one first doping type region and the at least one second doping type region is reverse biased so that a space charge region (depletion region) expands in each of these doped regions in directions that are substantially perpendicular to the current flow direction.

A voltage blocking capability of a superjunction device is, inter alia, dependent on how well the amount of first type doping atoms in the first doping type region is adapted to the amount of second type doping atoms in the second doping type region. More precisely, the voltage blocking capability is dependent on how well the amount of first type doping atoms is adapted to the amount of second type doping atoms at each position in the current flow direction of the drift region. One device may include sections of the drift region where the amount of first type doping atoms and the amount of second type doping atoms is completely balanced, sections where the amount of first type doping atoms exceeds the amount of second type doping atoms, and/or sections where the amount of second type doping atoms exceeds the amount of first type doping atoms. However, in each of these cases it is desirable to exactly control the amount of first type and second type doping atoms introduced into the drift region during a manufacturing process. It is also desirable to prevent any first type and second type doping atoms that have been introduced into the drift region from leaving the drift region again and passing into a gaseous phase (so-called outgassing).

SUMMARY

One example relates to a method for producing a semiconductor device, the method including forming a plurality of semiconductor arrangements one above the other, wherein forming each of the plurality of semiconductor arrangements comprises forming a semiconductor layer, forming a plurality of trenches in a first surface of the semiconductor layer, and implanting dopant atoms of at least one of a first type and a second type into at least one of a first sidewall and a second sidewall of each of the plurality of trenches. Forming of at least one of the plurality of semiconductor arrangements further includes forming a protective layer covering mesa regions between the plurality of trenches of the respective semiconductor layer, and covering the bottoms, the first sidewalls and the second sidewalls of each of the plurality of trenches that are formed in the respective semiconductor layer.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
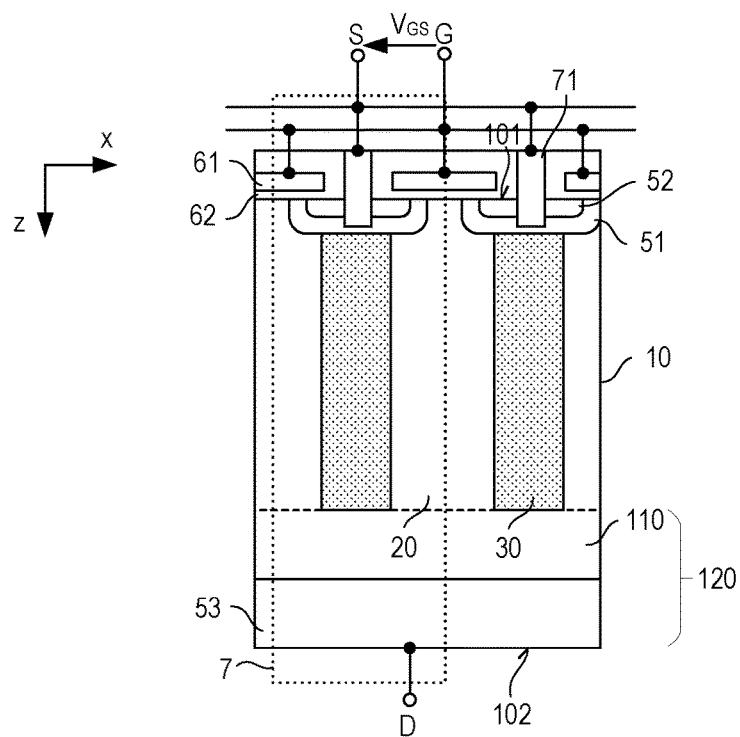
FIG. 1 schematically illustrates the general structure of a semiconductor device comprising drift regions and compensation regions.

FIG. 1 schematically illustrates a vertical cross-sectional view of a superjunction device comprising a semiconductor body 10. The semiconductor body 10 may include a conventional semiconductor material such as, for example, silicon (Si), silicon carbide (SiC), gallium nitride (GaN), gallium arsenide (GaAs), or the like. A transistor device is formed in the semiconductor body 10. In FIG. 1, only a small section of the transistor device is shown. The semiconductor body 10 includes at least one working transistor cell 7 with a gate electrode 61 that is dielectrically insulated from a body region 51 by a gate dielectric 62. The body region 51 is a doped semiconductor region of the semiconductor body 10. In the example illustrated in FIG. 1, the body region 51 extends from a first surface 101 into the semiconductor body 10, and the gate electrode 61 is arranged above the first surface 101 of the semiconductor body 10. Each of the transistor cells 7 further includes at least one source region 52 extending from the first surface 101 into the body region 51.

The transistor device illustrated in FIG. 1 further includes a drift region 20 formed in the semiconductor body 10. The drift region 20 adjoins the body region 51 of the at least one transistor cell 7 and forms a pn-junction with the body region 51. The drift region 20 is arranged between the body region 51 of the at least one transistor cell 7 and a semiconductor layer 120. The semiconductor layer 120 is arranged between a second surface 102 of the semiconductor body 10 and the drift region 20. The second surface 102 is arranged opposite to the first surface 101 in a vertical direction y of the semiconductor body 10.

The semiconductor layer 120 comprises a drain region 53 of the same doping type as the drift region 20 and adjoining the second surface 102. A vertical field-stop-region 110 of the same doping type as the drift region 20 and the drain region 53, but less highly doped than the drain region 53, may be arranged between the drift region 20 and the drain region 53. That is, the semiconductor layer 120 may be formed by the drain region 53 and the adjoining vertical field-stop-region 110, as is illustrated in FIG. 1. The vertical field-stop-region 110 may be formed by a single layer or by a plurality of separate sub-layers, e.g., at least two sub-layers. Sub-layers that are arranged closer to the drift region 20 may be less highly doped than sub-layers that are arranged further away from the drift region 20. For example, a doping concentration of a sub-layer that is arranged adjacent to the drift region 20 may be selected from a range of between 1E15 and 1E16 cm$^{-3}$ or lower. A doping concentration of a sub-layer that is arranged adjacent to the drain region 53 may be higher than a doping concentration of a sub-layer that is arranged horizontally above. The doping concentration of the sub-layer that is arranged adjacent to the drain region 53, however, may be lower than a doping concentration of the drain region 53. Generally speaking, a doping concentration of the different sub-layers may increase from the drift region 20 towards the drain region 53.

Still referring to FIG. 1, the transistor device includes at least one vertical compensation region 30 of a doping type complementary to the doping type of the drift region 20. According to one example, the transistor device includes a plurality of transistor cells 7 and each transistor cell 7 includes a vertical compensation region 30 adjoining the body region 51 of the respective transistor cell 7. In a vertical direction z of the semiconductor body 10, which is a direction perpendicular to the first surface 101 and to the second surface 102, the at least one vertical compensation region 30 extends from the body region 51 into the semiconductor body 10 towards the semiconductor layer 120.

Still referring to FIG. 1, the transistor device further includes a source electrode S. The source electrode S is electrically connected to the at least one source region 52 and the body region 51 of the at least one transistor cell 7 by means of contact plugs 71. The contact plugs 71 may comprise at least one of polysilicon, tungsten, aluminum, copper, and a Ti/TiN barrier liner, for example. This source electrode S forms a source node or is electrically connected to a source node of the transistor device. The transistor device further includes a drain node D electrically connected to the drain region 53. A drain electrode electrically connected to the drain region 53 may form the drain node D.

The transistor device can be an n-type transistor device or a p-type transistor device. The device type is defined by the doping type of the at least one source region 52. In an n-type transistor device, the source region 52 is an n-type region, the body region 51 is a p-type region, the drift region 20, which has a doping type complementary to the doping type of the body region 51, is an n-type region, and the at least one vertical compensation region 30 is a p-type region. In a p-type transistor device, the source region 52 is a p-type region, the body region 51 is an n-type region, the drift region 20 is a p-type region, and the at least one vertical compensation region 20 is an n-type region. The transistor device can be implemented as a MOSFET, for example. In a MOSFET, the drain region 53 has the same doping type as the drift region 20, as has been described above. For example, a doping concentration of the drain region 53 is selected from a range of between 1E18 and 1E19 cm$^{-3}$, 1E18 and 1E20 cm$^{-3}$, or 1E18 and 1E21 cm$^{-3}$, doping concentrations of the drift region 20 and the vertical compensation region 30 are selected from at least 1E15 cm$^{-3}$, at least 1E16 cm$^{-3}$, or at least 1E17 cm$^{-3}$, and a doping concentration of the body region 51 is selected from between 5E16 cm$^{-3}$ and 1E18 cm$^{-3}$. The transistor cells 7 illustrated in the Figures are planar transistor cells. Implementing the transistor cells 7 as planar transistor cells, however, is only one example. According to another example (not specifically illustrated) the transistor cells 7 are implemented as trench transistor cells. That is, the at least one gate electrode 61 is arranged in a trench that extends from the first surface 101 into the semiconductor body 10.

In the transistor device explained above, a plurality of transistor cells 7 is connected in parallel. That is, the source regions 52 of these transistor cells 7 are connected to the source node S, the common drain region 53 is connected to the drain node D, and the at least one gate electrode 61 is connected to a gate node G.

The drift regions 20 and the compensation regions 30 form an arrangement of vertical columns in the semiconductor body 10. The doping type of the compensation regions 30 is opposite to the doping type of the drift regions 20. The drift regions 20 may be formed by implanting dopant atoms of a first type into the semiconductor body 10, and the compensation regions 30 may be formed by implanting dopant atoms of a second type into the semiconductor body 10.

Measurements have revealed that in the finished semiconductor device in some sections of the semiconductor body 10 a doping concentration may be lower than in other sections. In particular, in the finished semiconductor device there may be certain sections wherein a doping concentration of the drift regions 20 is higher than the doping concentration of drift regions 20 in other sections of the semiconductor body 10. For example, a doping concentration of the drift region 20 in some transistor cells 7 may be higher than the doping concentration of the drift region 20 in other transistor cells 7. The same applies for the compensation regions 30. That is, within one semiconductor body 10, a doping concentration of at least one of the drift regions 20 and the compensation regions 30 may differ between different transistor cells 7. A doping concentration may also differ between different semiconductor bodies 10 treated in the same production process. Such undesirable variations of the doping concentration may exhibit a systematic and/or a statistic variation.

The variations of the doping concentration may occur due to an effect which may be referred to as outgassing. During certain production processes, doping atoms that were implanted into the semiconductor before, may enter the gaseous phase and leave the semiconductor body. This outgassing usually occurs when the semiconductor body 10 is exposed to high temperatures. A temperature within a processing chamber may not be constant for each position within the processing chamber. In many cases, the temperature within the processing chamber is higher at some positions, and lower at other positions. Therefore, if a complete wafer is treated within a processing chamber, some areas of the wafer may be heated more than others. One wafer may include a plurality of semiconductor bodies 10. Therefore, the outgassing may be more severe in some areas of a wafer or semiconductor body than in others. The specific pattern of the outgassing effect on a single wafer generally depends on the characteristics of the processing chamber. That is, the pattern may be different for different processing chambers. The effect of outgassing will be explained in more detail further below.

The concentration of dopant atoms in the finished semiconductor device may differ radially over the wafer or semiconductor body 10. The varying doping concentration may form a rounded pattern, or an oval pattern, for example. Other shapes are generally also possible. This results in several different concentric sections of the wafer or semiconductor body 10. One wafer or semiconductor body 10, for example, may comprise at least two different sections. If the complete wafer comprises two or more different sections, one of the plurality of semiconductor bodies 10 may extend within only one section, or may extend over two or even more different sections. The doping concentration of the drift regions 20 and the compensation regions 30 in a single section may be essentially constant. The doping concentration between different sections, however, may differ from each other. The boundaries between different directly adjoining sections, however, may not always be sharp borders. That is, the doping concentration within one section may increase or decrease continuously within the respective section. In this way, the doping concentration of a first section in an edge region of this section may only be marginally smaller or larger than the doping concentration in an edge region of a second section directly adjoining the first section. The boundary line between two adjoining sections may be determined by defining appropriate thresholds. If, for example, a doping concentration exceeds a certain threshold, the respective area may be assigned to the first section, while an area in which the doping concentration is below the threshold may be assigned to the second section, or vice versa. In this way, a plurality of different sections may be defined.

Figures 2A, 2B:
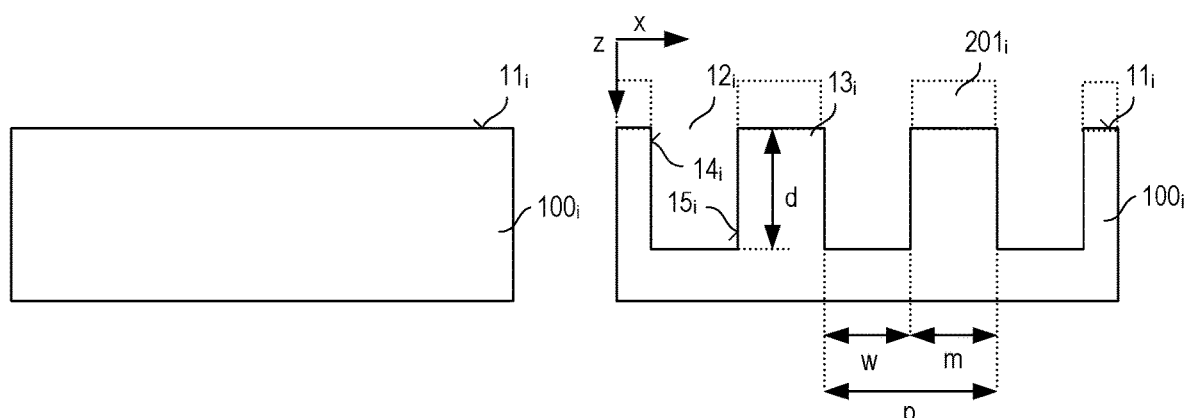
FIGS. 2A-2F illustrate a method for producing a plurality of semiconductor arrangements one above the other, with each semiconductor arrangement including a semiconductor layer, a plurality of trenches in the semiconductor layer, and implanted regions along opposite sidewalls of the trenches.

Now referring to FIGS. 2A-2F, a method for forming a semiconductor structure is schematically illustrated. Referring to FIG. 2A, the method includes forming a semiconductor layer $100_i$ with a first surface $11_i$. FIG. 2A shows a vertical cross-sectional view of the semiconductor layer $100_i$, that is, a view in a section plane perpendicular to the first surface $11_i$. According to one example, the semiconductor layer $100_i$ is a monocrystalline layer and a material of the semiconductor layer $100_i$ is silicon.

Referring to FIG. 2B, the method further includes forming a plurality of trenches $12_i$ in the first surface $11_i$ of the semiconductor layer $100_i$. According to one example, the trenches $12_i$ are formed such that they are elongated in a direction perpendicular to the section plane shown in FIG. 2B. "Elongated" means that a length of the trenches $12_i$ in this direction perpendicular to the section plane is several times a width w of the trenches $12_i$. According to one example, the length of each of the trenches $12_i$ is at least 10 (1E1), at least 100 (1E2), at least 1000 (1E3), or at least 10000 (1E4) times the width w. According to one example, the trenches $12_i$ are formed to have an aspect ratio which is a ratio between a depth d and the width w, of at least 1:1, at least 2:1, at least 10:1, or at least 20:1. The width w of the trenches $12_i$ is their dimension in a first lateral direction x, and the depth d is their dimension in a vertical direction z. The vertical direction z is perpendicular to the first lateral direction x and the first surface $11_i$. The lateral direction perpendicular to the section plane shown in FIG. 2B, that is, perpendicular to the first lateral direction x (and the vertical direction z) is referred to as second lateral direction y in the following.

According to one example, the trenches $12_i$ are formed to have a width w of between 0.5 micrometers (μm) and 9 micrometers, in particular between 1 micrometer and 5 micrometers, or between 1 micrometer and 3 micrometers. Referring to FIG. 2B, the trenches $12_i$ are separated by mesa regions $13_i$, which are sections of the semiconductor layer $100_i$ remaining between the trenches $12_i$ after the etching process. According to one example, a width m of these mesa regions $13_i$ in the first lateral direction x is between 0.5 micrometers (μm) and 9 micrometers, in particular between 0.5 micrometers and 5 micrometers, or between 0.5 micrometers and 3 micrometers. A pitch p, which is given by the width w of one trench $12_i$ and the width m of one mesa region $13_i$ adjoining the respective trench $12_i$, is between 1 micrometer (μm) and 18 micrometers, in particular between 1.5 micrometers and 9 micrometers.

According to one example, the trenches $12_i$ have substantially the same width w. According to one example, the trenches $12_i$ are substantially equally spaced in the first lateral direction x of the semiconductor layer $100_i$, that is, the mesa regions $13_i$ have substantially the same width m. According to one example, the mesa regions $13_i$ are slim as compared to the trenches $12_i$. For example, a width m of the mesa regions $13_i$ in the first lateral direction x may be between 0.5 micrometers and 3 micrometers, while the trenches $12_i$ are formed to have a width w of between 6 micrometers and 9 micrometers.

Forming the plurality of trenches $12_i$ may include forming an etch mask $201_i$ (illustrated in dashed lines in FIG. 2B) on the first surface $11_i$ and etching the semiconductor layer $100_i$ in those regions of the first surface $11_i$ that are not covered by the etch mask $201_i$. According to one example, the etching process is a dry etching process. According to another example, the etching process is a wet etching process using an alkaline etchant. Examples of an alkaline etchant include, but are not restricted to, TMAH (Tetramethylammoniumhydroxide), KOH, CaOH, or NH4OH. According to one example, a temperature during the etching process is about 80° C. and a concentration of the etchant is between 20% and 30%, in particular about 25%.

According to one example, the semiconductor layer $100_i$ is a monocrystalline silicon layer and formed such that the first sidewall $14_i$ and the second sidewall $15_i$ run in a $\{100\}$ plane of the crystal lattice of the silicon layer. According to another example, the semiconductor layer $100_i$ is a monocrystalline silicon layer and formed such that the first surface $11_i$ is in a $\{110\}$ plane of the crystal lattice of the silicon layer. Consequently, in the latter example, edges of the trenches $12_i$ between the first surface $11_i$ and each of the first sidewall $14_i$ and the second sidewall $15_i$ run in a <112> direction of the trenches $12_i$.

Figure 2C:
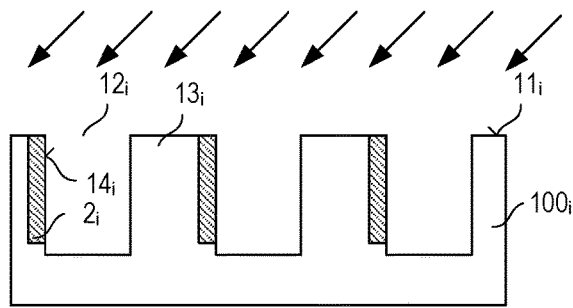
Figure 2D:
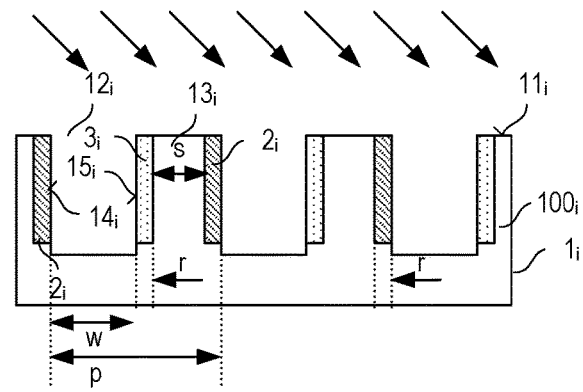

The method further includes implanting dopant atoms of at least one of a first type and a second type into at least one of the first sidewall $14_i$ and the second sidewall $15_i$ of each of the plurality of trenches $12_i$. In the example method shown in FIGS. 2A to 2F, implanting the dopant atoms includes implanting first type dopant atoms into the first sidewalls $14_i$ of the plurality of trenches $12_i$, and implanting second type dopant atoms into the second sidewalls $15_i$ of the plurality of trenches $12_i$. Implanting the first type dopant atoms into the first sidewalls $14_i$ is illustrated in FIG. 2C, and implanting the second type dopant atoms into the second sidewalls $15_i$ is illustrated in FIG. 2D. Implanting the first type dopant atoms results in first type regions $2_i$ along the first sidewalls $14_i$, and implanting the second type dopant atoms results in second type regions $3_i$ along the second sidewalls $15_i$. In the semiconductor arrangement $1_i$ shown in FIG. 2D, a distance between the first type region $2_i$ at the first sidewall $14_i$ of the trench $12_i$ and the second type region $3_i$ at the second sidewall $15_i$ of the trench $12_i$ is given by the width w of the trench $12_i$. In FIG. 2D, s denotes the distance between the first type region $2_i$ and the second type region $3_i$ arranged in the same mesa region $13_i$. Furthermore, r denotes a dimension of the first type region $2_i$ and the second type region $3_i$ in the first lateral direction x. According to one example, the first type region $2_i$ and the second type region $3_i$ are substantially equally spaced so that s≈w. This can be achieved by forming the trenches $12_i$ with a width w which is given by w=p/2−r, where p is the pitch and r is the dimension of each of the first type regions $2_i$ and the second type regions $3_i$ in the first lateral direction x.

When implanting the dopant atoms of the first type and the dopant atoms of the second type, an implantation dose of both the first type dopant atoms and the second type dopant atoms may be equal for each of the at least two sections of the wafer or semiconductor body. That is, an implantation dose may be the same for each of the plurality of trenches $12_i$.

It is, however, also possible that implanting dopant atoms of at least one of a first type and a second type comprises implanting dopant atoms of a first type and dopant atoms of a second type into the semiconductor body 10, wherein an implantation dose of at least one of the first type dopant atoms and the second type dopant atoms for each of at least two sections of the wafer or semiconductor body 10 differs from the implantation dose of the corresponding type of dopant atoms of at least one other section of the at least two sections. That is, an implantation dose implanted into the trenches $12_i$ arranged in a first section may differ from an implantation dose implanted into the trenches $12_i$ arranged in at least one other section of the plurality of sections.

The processing illustrated in FIGS. 2A-2D which includes forming the semiconductor layer $100_i$, forming a plurality of trenches $12_i$ in the first surface $11_i$ of the semiconductor layer $100_i$, and implanting dopant atoms of at least one of a first type and a second type into at least one of the first sidewall $14_i$ and the second sidewall $15_i$ of each of the plurality of trenches $12_i$ forms one of a plurality of semiconductor arrangements. A semiconductor arrangement is referred to as $1_i$ in FIG. 2D. Forming another semiconductor arrangement $1_{i+1}$ on top of the semiconductor arrangement $1_i$ shown in FIG. 2D includes the same processing as explained with reference to FIGS. 2A-2D.

In the following, two semiconductor arrangements $1_i$ formed one above the other are referred to as a pair of semiconductor arrangements, wherein the semiconductor arrangement that is formed first is referred to as bottom semiconductor arrangement and the semiconductor arrangement formed on the bottom semiconductor arrangement is referred to as top semiconductor arrangement. Consequently, the semiconductor arrangement $1_i$ shown in FIG. 2D is also referred to as bottom semiconductor arrangement, and the semiconductor arrangement $1_{i+1}$ that is formed in the processing explained with reference to FIGS. 2E-2F below is also referred to as top semiconductor arrangement. Equivalently, the semiconductor layer $100_i$ of the bottom semiconductor arrangement $1_i$ is referred to as bottom semiconductor layer $100_i$, and a semiconductor layer $100_{i+1}$ of the top semiconductor arrangement $1_{i+1}$ is referred to as top semiconductor layer. It should be noted that the terms "bottom" and "top" merely describe the relative relationship between two semiconductor arrangements, with the semiconductor arrangement referred to as "bottom semiconductor arrangement" being the one that is formed before the semiconductor arrangement referred to as "top semiconductor arrangement". That is, in a structure with more than two semiconductor arrangements, one and the same semiconductor arrangement can be referred to as top semiconductor arrangement relative to one semiconductor arrangement, and as bottom semiconductor arrangement relative to another semiconductor arrangement.

Figure 2E:
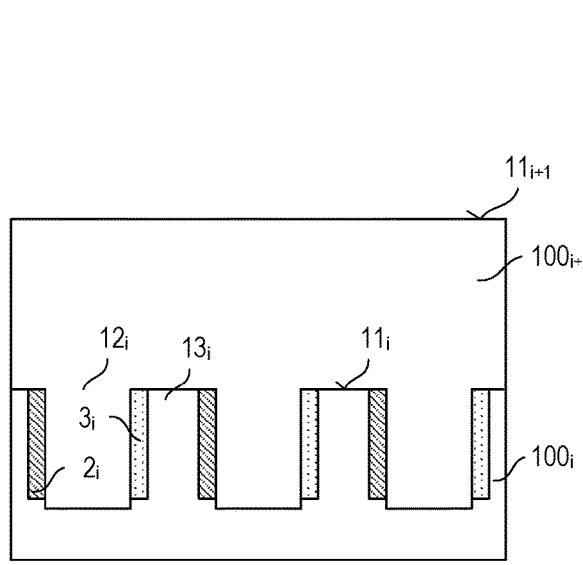

Referring to FIG. 2E, forming the top semiconductor arrangement $1_{i+1}$ includes forming a top semiconductor layer $100_{i+1}$ on the bottom semiconductor layer $100_i$. According to one example, and as shown in FIG. 2E, forming the top semiconductor layer $100_{i+1}$ on the bottom semiconductor layer $100_i$ includes forming the top semiconductor layer $100_{i+1}$ in the plurality of bottom trenches $12_i$ and on top of the bottom mesa regions $13_i$. According to one example, the top semiconductor layer $100_{i+1}$ is formed such that it completely fills the bottom trenches $12_i$ and completely covers the bottom mesa regions $13_i$. According to one example, the top semiconductor layer $100_{i+1}$ is formed to have a thickness such that the top semiconductor layer $100_{i+1}$ has a substantially planar first surface $11_{i+1}$. Optionally, the first surface $11_{i+1}$ is planarized using one of a chemical polishing process, a mechanical polishing process or a chemical-mechanical polishing (CMP) process.

According to one example, forming the top semiconductor layer $100_{i+1}$ includes epitaxially growing the top semiconductor layer $100_{i+1}$ on the bottom semiconductor layer $100_i$. If, for example, the first surface $11_i$ of the bottom semiconductor layer $100_i$ is in a $\{110\}$ plane of the crystal lattice, a first surface $11_{i+1}$ of the top semiconductor layer $100_{i+1}$ is in a $\{110\}$ plane of the crystal lattice of the top semiconductor layer $100_{i+1}$. According to one example, epitaxially growing the top semiconductor layer $100_{i+1}$ includes epitaxially growing the top semiconductor layer $100_{i+1}$ at a growth rate of more than 500 nanometers per minute or more than 1 micrometer per minute. The "growth rate" as defined herein is the growth rate on a horizontal surface without trenches. The growth rate on the mesa regions $13_i$ is lower as the deposited material not only grows on the mesa regions $13_i$ but also fills the trenches $12_i$.

Figure 2F:
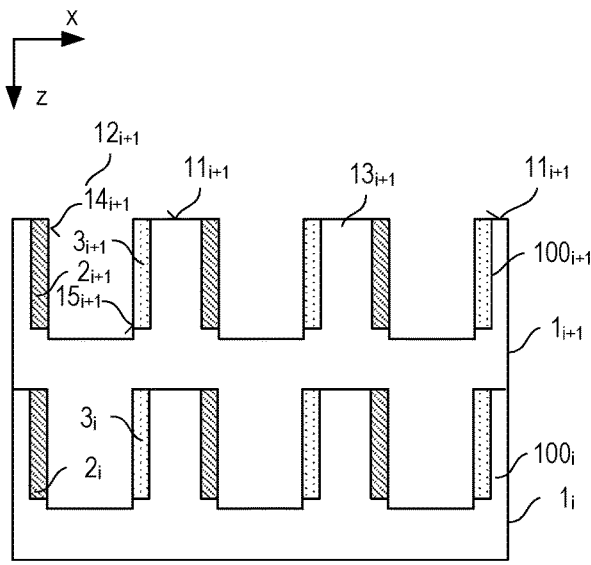

Referring to FIG. 2F, forming the top semiconductor arrangement $1_{i+1}$, further includes forming a plurality of trenches $12_{i+1}$ in a first surface $11_{i+1}$ of the top semiconductor layer $100_{i+1}$ and implanting dopant atoms of at least one of a first type and a second type into at least one of a first sidewall $14_{i+1}$ and a second sidewall $15_{i+1}$ of each of the plurality of trenches $12_{i+1}$ of the top semiconductor layer $100_{i+1}$. In the example shown in FIG. 2F, like in the bottom semiconductor arrangement $1_i$, dopant atoms of the first type are implanted into the first sidewalls $14_{i+1}$ of the trenches $12_{i+1}$, and dopant atoms of the second type are implanted into the second sidewalls $15_{i+1}$ of the trenches $12_{i+1}$. Everything that is explained with reference to the trenches $12_i$ of the bottom semiconductor arrangement $1_i$ herein above applies to the trenches $12_{i+1}$ of the top semiconductor arrangement $1_{i+1}$ accordingly. According to one example, a width w of the trenches $12_{i+1}$ in the top semiconductor layer $100_{i+1}$ substantially equals the width w of the trenches $12_i$ in the bottom semiconductor layer $100_i$, and a width of the mesa regions $13_{i+1}$ of the top semiconductor layer $100_{i+1}$ substantially equals the width m of the mesa regions $13_i$ in the bottom semiconductor layer $100_i$.

According to one example, the trenches $12_{i+1}$ in the top semiconductor layer $100_{i+1}$ are formed such that the first sidewalls $14_{i+1}$ of these trenches $12_{i+1}$ are aligned with the first sidewalls $14_i$ of the trenches $12_i$ (which, when forming the trenches $12_{i+1}$, have already been filled with the top semiconductor layer $100_{i+1}$) and the second sidewalls $15_{i+1}$ of the trenches $12_{i+1}$ are aligned with the second sidewalls $15_i$ of the trenches $12_i$ so that first type regions $2_{i+1}$, resulting from implanting first type dopant atoms into the first sidewalls $14_{i+1}$ of the trenches $12_{i+1}$ in the top semiconductor arrangement $1_{i+1}$ are arranged directly above doped regions $2_i$ resulting from implanting first type dopant atoms into the first sidewalls $14_i$ of the trenches $12_i$ of the bottom semiconductor arrangement $1_i$. Equivalently, doped regions $3_{i+1}$ resulting from implanting second type dopant atoms into the second sidewalls $15_{i+1}$ of the trenches $12_{i+1}$ in the top semiconductor arrangement $1_{i+1}$ are arranged directly above doped regions $3_i$ resulting from implanting second type dopant atoms into the second sidewalls $15_i$ of the trenches $12_i$ in the bottom semiconductor arrangement $1_i$.

In FIGS. 2A-2F, the bottom semiconductor arrangement $1_i$, and the top semiconductor arrangement $1_{i+1}$ and their respective features have like reference characters that are only different in the subscript index, which is "i" in the case of the bottom semiconductor arrangement $1_i$, and "$_{+1}$" in the case of the top semiconductor arrangement $1_{i+1}$. In the following, if explanations equivalently apply to any of the semiconductor arrangements $1_i$, $1_{i+1}$ or to a feature of any of the semiconductor arrangements $1_i$, $1_{i+1}$, reference characters without index are used. That is, any one of the plurality of the semiconductor arrangements $1_i$, $1_{i+1}$ is referred to as "the semiconductor arrangement 1", any one of the plurality of the semiconductor layers $100_i$, $100_{i+1}$ is simply referred to as "the semiconductor layer 100", any one of the plurality of the trenches $12_i$, $12_{i+1}$ in the semiconductor layers $100_i$, $100_{i+1}$ is referred to as "the trenches 12", and so on.

Although not shown in FIGS. 2A-2F, the processing explained with reference to FIGS. 2E to 2F may be repeated several times to form more than two semiconductor arrangements of the same type as the bottom semiconductor arrangement $1_i$, and the top semiconductor arrangement $1_{i+1}$ shown in these figures one above each other.

Figure 3:
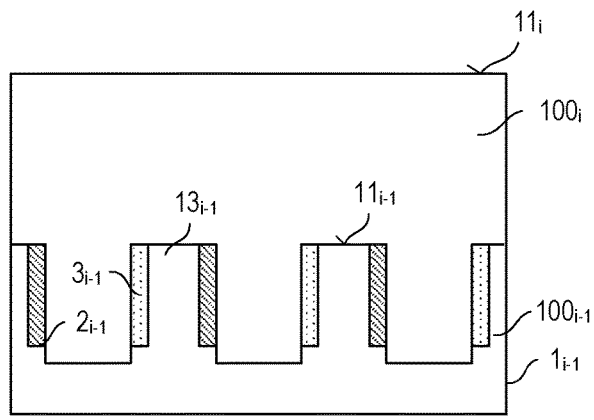
FIG. 3 shows one example of a structure below the semiconductor layer shown in FIG. 2A.

Epitaxially growing the individual semiconductor layers $10_i$, $10_{i+1}$ results in a monocrystalline layer arrangement, whereas "layer arrangement" denotes the plurality of semiconductor layers formed one above the other. In the monocrystalline layers arrangement, there is no visible border between the individual epitaxial layers. Nevertheless, just for the purpose of illustration, borders between the individual layers are illustrated by lines in FIG. 2F and the following figures. FIGS. 2A-2F do not explicitly show where the bottom semiconductor layer $100_i$ is formed. According to one example, shown in FIG. 3, the bottom semiconductor layer $100_i$ is formed on yet another semiconductor arrangement $1_{i-1}$ of the same type as the bottom and top semiconductor arrangements $1_i$, $1_{i+1}$ explained with reference to FIGS. 2A-2F. Relative to a semiconductor layer $100_{i-1}$ of this semiconductor arrangement $1_{i-1}$, the semiconductor layer $100_i$ is the top semiconductor layer.

Figure 4:
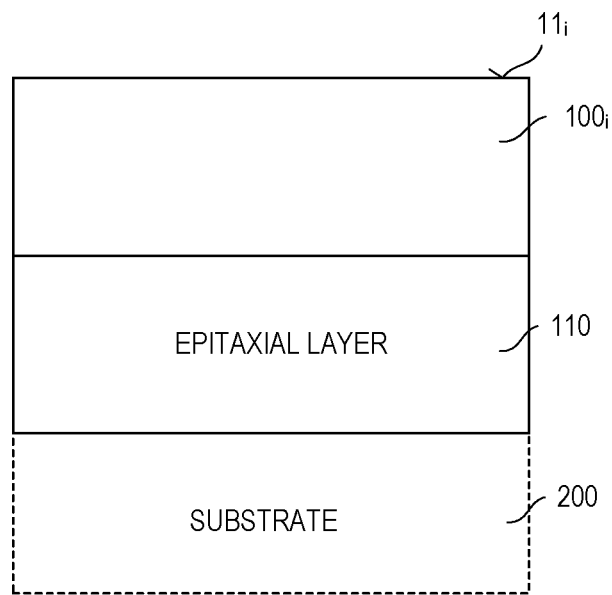
FIG. 4 shows another example of a structure below the semiconductor layer shown in FIG. 2A.

According to another example shown in FIG. 4, the bottom semiconductor layer $100_i$ is grown on an epitaxial layer 110. According to one example (illustrated in dashed lines in FIG. 4), the epitaxial layer 110 has been grown on a semiconductor substrate 200. According to one example, the epitaxial layer 110 has a substantially homogenous doping concentration.

Figure 5:
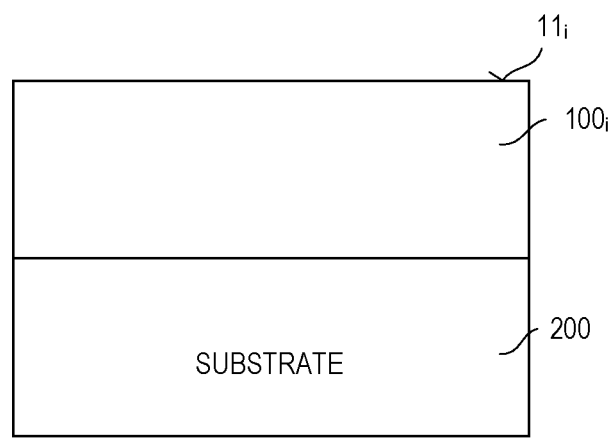
FIG. 5 shows another example of a structure below the semiconductor layer shown in FIG. 2A.

According to yet another example shown in FIG. 5, the semiconductor layer $100_i$ shown in FIG. 2A is grown on a semiconductor substrate 200. A substrate 200, for example, is a piece of monocrystalline semiconductor formed by or cut from a semiconductor wafer.

Figure 6:
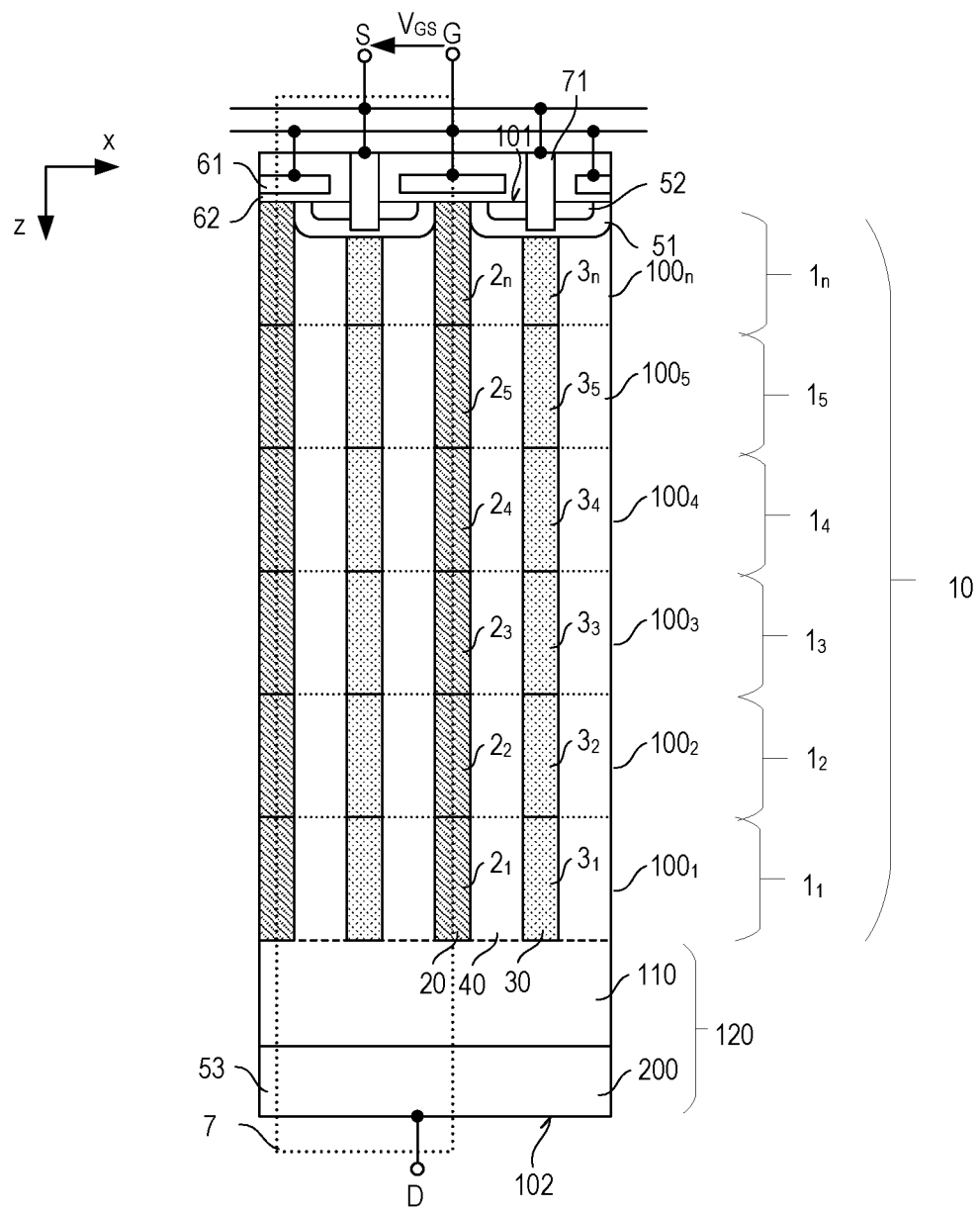
FIG. 6 shows a semiconductor device based on a structure with a plurality of semiconductor arrangements.

Based on the method explained with reference to FIGS. 2A-2F, a semiconductor structure with a plurality of semiconductor arrangements 1 can be formed with each of these semiconductor arrangements 1 including a plurality of first type doped regions 2 and a plurality of second type doped regions 3. Referring to the above, this semiconductor structure may form a drift region 20 of a superjunction device. FIG. 6 schematically illustrates a vertical cross-sectional view of a superjunction device that includes a plurality of n semiconductor arrangements 1 formed one above the other in a semiconductor body 10. Just for the purpose of illustration, n=6 in this example. The semiconductor device, however, may comprise any suitable number n of semiconductor arrangements, with n≥1. That is, some semiconductor devices may comprise only a single (one) semiconductor arrangement 1. Referring to FIG. 6, doped first type regions 2 of the individual semiconductor arrangements 1 are arranged one above the other in a vertical direction z, and first type regions 2 of adjoining semiconductor layers 100 adjoin each other so that those first type regions 2 that are arranged one above the other in the vertical direction z form a continuous first type region 20. Equivalently, second type regions 3 of the individual semiconductor arrangements 1 form a continuous second type region 30. The semiconductor arrangements $1_i$, $1_{i+1}$ explained with reference to FIG. 2F, represent any pair of adjacent semiconductor arrangements 1 in the superjunction device shown in FIG. 6. That is, each of the semiconductor arrangements 1 shown in FIG. 6 can be formed in accordance with the method shown in FIGS. 2A-2F. Referring to FIG. 2F, first type regions 2 in adjacent semiconductor arrangements 1 can be produced to be spaced apart in the vertical direction z. Equivalently, second type regions 3 in adjacent semiconductor arrangements 1 can be produced to be spaced apart in the vertical direction z. From the structure shown in FIG. 2F, a structure with adjoining first type regions 2 and adjoining second type regions 3 as shown in FIG. 6 can be obtained by an annealing process in which the implanted dopant atoms diffuse in the vertical direction z (and the first lateral direction x) and are electrically activated (by being incorporated into substitutional sites of a crystal lattice of the semiconductor layers 100).

According to one example, one common annealing process is performed to diffuse and activate the dopant atoms in each of the plurality of semiconductor arrangements 1 formed one above the other. According to one example, a temperature in the annealing process that causes the dopant atoms to diffuse and to be activated is below 1300° C., in particular below 1200° C., or below 1100° C. A duration of the annealing process may be between 30 minutes and 10 hours (600 minutes), for example. Other durations, especially longer durations of up to 1000 minutes or even more, however, are also possible.

The drift region shown in FIG. 6 includes a lowermost semiconductor arrangement $1_1$. This lowermost semiconductor arrangement $1_1$—which may also be referred to as a first semiconductor arrangement as it is the first semiconductor arrangement that is formed—is formed on a substrate 200 or (as shown) on an optional epitaxial layer 110 formed on the substrate 200.

The superjunction device shown in FIG. 6 is implemented as a MOSFET. In this case, the substrate 200 forms a drain region 53 that is connected to a drain node D (which is only schematically illustrated in FIG. 6) of the MOSFET. The MOSFET may include a plurality of device cells 7, whereas two of such device cells 7 are shown in FIG. 6. In the example illustrated in FIG. 6, each of these device cells 7 includes one first type region 20 and one second type region 30. The plurality of device cells 7 share the drain region 53 and the epitaxial layer 110, whereas the epitaxial layer 110 is part of the drift region of the superjunction MOSFET.

Each device cell (transistor cell) 7 further includes a source region 52, a body region 51 separating the source region 52 from the drift region, and a gate electrode 61 dielectrically insulated from the body region 51 by a gate dielectric 62. The gate electrodes 61 of the individual device cells 7 are electrically connected to a common gate node G, and the source and body regions 51, 52 of the individual device cells 7 are electrically connected to a source node S via respective source electrodes or contact plugs 71. The second type region 30 of each device cell 7 adjoins the body region 51, according to one example. The gate electrode 61 serves to control a conducting channel in the body region 51 between the source region 52 and the drift region, in particular the second type region 20 of the drift region.

The body regions 51 and the source regions 52 can be formed in the uppermost semiconductor arrangement $1_n$ by at least one of an implantation and a diffusion process. Before this at least one implantation and diffusion process, the trenches (corresponding to the trenches $12_{i+1}$ shown in FIG. 2F) of the uppermost semiconductor arrangement $1_n$ can be filled in accordance with the process explained with reference to FIG. 2E, that is, by epitaxially growing a semiconductor layer that fills the trenches $12_{i+1}$ and, optionally, planarizing this semiconductor layer. The source and body regions 51, 52 may then be formed using at least one of an implantation and diffusion process in this semiconductor layer. The epitaxial layer in which the source and body regions 51, 52 are formed may be thinner in the vertical direction z than the epitaxial layers 100 explained before. According to one example, a thickness of this epitaxial layer $100n$ is between 1 and 3 micrometers, in particular, about 2 micrometers. The gate dielectric 62 includes an oxide, for example, and may be formed using an oxidation or deposition process. The gate electrode $61_i$, for example, includes one of a metal and a highly doped polycrystalline semiconductor material such as, e.g., polysilicon.

As has been described with respect to FIG. 1 above, the superjunction MOSFET can be an n-type MOSFET or a p-type MOSFET. The superjunction MOSFET can be operated in an on-state or an off-state. In the on-state, the gate electrode 61, driven by a drive voltage VGS applied between the gate node G and the source node S, generates a conducting channel in the body region 51 between the source region 52 and the first type region 20 so that upon applying a voltage between the drain node D and the source node S a current can flow between the drain node D and the source node S. In the off-state, the gate electrode 61 is driven such that the conducting channel in the body region 51 is interrupted. For the purpose of explanation it is assumed that the MOSFET is in the off-state and a voltage is applied between the drain node D and the source node S that reverse biases a pn-junction between the body region 51 and the first type region 20 and a pn-junction between the first type region 20 and the second type region 30. In this case, space charge regions expand in the first type region 20, the body region 51, and also the second type region 30, whereas the first type regions 20 and the second type regions 30 may be completely depleted. According to one example, a doping concentration of the body region 51 is high enough for the body region 51 to not be depleted completely.

In the annealing process explained above, the first type regions 2 and the second type regions 3 may diffuse in the first lateral direction x such that first type regions and second type regions adjoin each other (see, e.g., FIG. 1). According to another example, shown in FIG. 6, regions 40 having a basic doping of the respective semiconductor layers 100 may remain between the first type regions 2 and the second type regions 3. The basic doping is a doping the semiconductor layers 100 have before the first type regions 2 and the second type regions 3 are formed.

According to one example, the semiconductor layers 100 are non-doped. As used herein, "non-doped" means that semiconductor layers 100 have a basic doping of less than 1E14 $cm^{-3}$ or even less than 2E13 $cm^{-3}$.

One figure of merit of a superjunction MOSFET is the specific on-resistance $R_{DS\_ON}*A$, which is the on-resistance $R_{DS\_ON}$ multiplied with the semiconductor area A consumed by the superjunction device in a plane perpendicular to the vertical direction z shown in FIG. 6. The specific on-resistance can be decreased by decreasing the pitch p, whereas the pitch, as shown in FIG. 6, is given by a distance between same device structures, such as first type regions 20, in the first lateral direction x. By the method explained with reference to FIGS. 2A-2F, a drift region with a relatively small pitch p can be produced because by virtue of implanting the dopant atoms into the sidewalls of the trenches 12 the doped regions mainly extend in the vertical direction z (in the first lateral direction x, a dimension of the doped regions is significantly smaller than the trench width as shown in FIG. 2D) and there is no need to diffuse the introduced dopant atoms deep into the respective semiconductor layer 100 in order to form contiguous first type and second type regions 20, 30. Furthermore, the implantation process allows to exactly control the amount of first type dopant atoms and second type dopant atoms introduced into the respective semiconductor layer 100. By this, the overall amount of first type dopant atoms and second type dopant atoms in each horizontal plane of the drift region can be exactly controlled. The "horizontal plane" is a plane perpendicular to the section plane shown in FIG. 6.

In the example illustrated in FIG. 6, the gate electrode 61 of each device cell 7 is a planar electrode that is arranged above a first surface 101 of the layer arrangement. This, however, is only an example. According to another example, the gate electrode of each device cell 7 is a trench electrode.

That is, the gate electrode 61 is arranged in a trench above the first type region 20 and adjacent the body region 51 and the source region 52, and the gate electrode 61 is dielectrically insulated from these regions by a gate dielectric 62.

In the example illustrated in FIGS. 2A-2F, first type dopant atoms are implanted only into the first sidewalls 14 of the trenches $12_i$ and second type dopant atoms are implanted only into the second sidewalls 15 of the trenches 12. This, however, is only an example. It is also possible that first type dopant atoms are implanted into both the first sidewall 14 and the second sidewall 15. The same applies for the second type dopant atoms which may also be implanted into both the first sidewall 14 and the second sidewall 15. According to one example, the first type dopant atoms may be implanted deeper into the first sidewall 14 than the second type dopant atoms, and the second type dopant atoms may be implanted deeper into the second sidewalls 15 than the first type dopant atoms. In this way, distinctive first type regions 2 and second type regions 3 may be formed in the first and second sidewalls 14, 15. During the annealing process, as has been described above, the implanted dopant atoms may diffuse in the vertical direction z as well as in the first lateral direction x and are electrically activated, thereby forming the drift regions 20 and compensation regions 30 (see, e.g., FIGS. 1 and 6).

According to another example, which will be described with respect to FIGS. 8A-8F below, a method may include implanting both first type dopant atoms and second type dopant atoms into at least one of the first sidewall 14 and the second sidewall of the trenches 12. This may result in a combined first and second type region 23 which includes both dopant atoms of the first type and the second type. The method further includes annealing the semiconductor structure to diffuse the first type dopant atoms and the second type dopant atoms in the semiconductor structure. The first type dopant atoms and the second type dopant atoms may be chosen such that they have different diffusion coefficients so that the annealing process, based on the implanted regions 23 results in adjoining first type semiconductor regions 20 and second type semiconductor regions 30. According to one example, the diffusion constant of one of the first type dopant atoms and the second type dopant atoms is at least 2 times or at least 4 times the diffusion constant of the other one of the first type dopant atoms and the second type dopant atoms. Pairs of dopant atoms that have different diffusion constants are boron (B) and arsenic (As), or boron (B) and antimony (Sb), for example. Boron is a p-type dopant, arsenic and antimony are n-type dopants. In each of these pairs, boron is the dopant with the higher diffusion coefficient. A ratio of the respective diffusion coefficients of boron and arsenic, for example, is between 2:1 and 4:1, depending on the diffusion process. That is, boron diffuses between two and four times as fast as arsenic.

According to one example, the method includes one annealing process after manufacturing the complete layer arrangement. That is, after all of the plurality of epitaxial layers have been formed, the dopant atoms are diffused in each of the plurality of semiconductor layers 100.

An implantation angle in the described implantation processes may be selected such that dopant atoms are implanted into the sidewalls 14, 15, but not the bottom of the trench 12. When implanting the dopant atoms at a certain (flat) angle, the dopant atoms may not be implanted very deep into the sidewalls 14, 15. At least some of the dopant atoms are rather implanted close to a surface of the sidewalls 14, 15. This increases the risk of outgassing. As has been described above, during the annealing process the implanted dopant atoms may diffuse in the vertical direction z as well as in the first lateral direction x and are electrically activated, thereby forming the drift regions 20 and compensation regions 30. As has further been described above, a temperature during the annealing process may be below 1300° C., in particular below 1200° C. or below 1100° C. A duration of the annealing process may be between 30 minutes and 10 hours (600 minutes). Other durations, especially longer durations of up to 1000 minutes or even more, however, are also possible. As the dopant atoms are usually implanted close to the surface of the sidewalls 14, 15, and additionally under the influence of the high temperatures, the effect of outgassing may occur. Some dopant atoms are even more prone to the effect of outgassing than others. For example, boron is usually more prone to outgassing than arsenic and antimony.

After forming one of a plurality of semiconductor arrangements $1_i$, that is, after implanting the first type dopant atoms and the second type dopant atoms, and before forming the semiconductor layer $100_{i+1}$ of a following top semiconductor arrangement, the wafer or semiconductor body 10 may come into contact with oxygen. This may cause the formation of native oxide on a surface of the bottom semiconductor arrangement. Such native oxide as well as any chemically formed oxide or other contaminants on the surface of the bottom semiconductor arrangement may negatively affect the growth of the monocrystalline semiconductor layer $100_{i+1}$ of the following top semiconductor arrangement. Therefore, such native oxide, chemically formed oxide, or other contaminants are usually removed before forming the semiconductor layer $100_{i+1}$ of the following top semiconductor arrangement. This requires a preconditioning step which involves performing a chemical reaction that is usually performed at temperatures of 1000° C., or even more. At a temperature of 1100° C., for example, such a preconditioning step may have a duration of about ten or several tens of seconds. At a somewhat lower temperature of about 1000° C., a preconditioning step may have a significantly longer duration of several hundreds of seconds, for example. Performing a preconditioning step at such high temperatures as well as any type of high temperature annealing process may increase the risk of outgassing.

Even further, forming the semiconductor layer $100_{i+1}$ of the following top semiconductor arrangement is usually also performed at comparably high temperatures in order to achieve satisfactory deposition rates. Therefore, outgassing may also occur during the step of growing the semiconductor layer $100_{i+1}$ of the following top semiconductor arrangement.

Figure 7A:
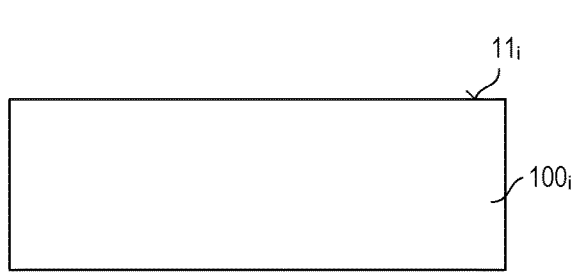
FIGS. 7A-7F illustrate one example of a method for producing a plurality of semiconductor arrangements one above the other, with each semiconductor arrangement including a semiconductor layer, a plurality of trenches in the semiconductor layer, and implanted regions along opposite sidewalls of the trenches.
Figure 7B:
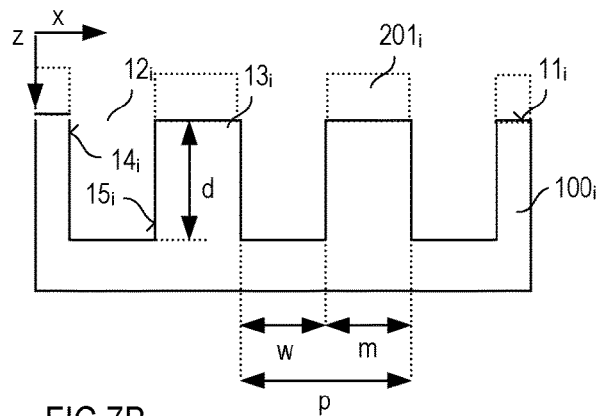
Figure 7C:
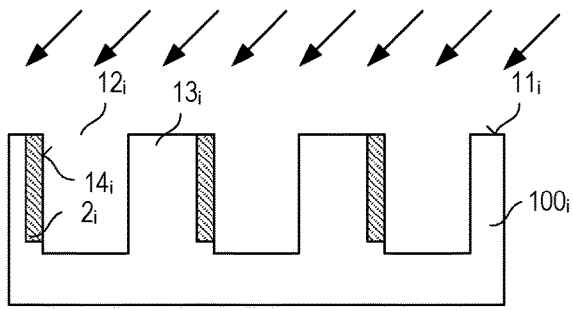
Figure 7D:
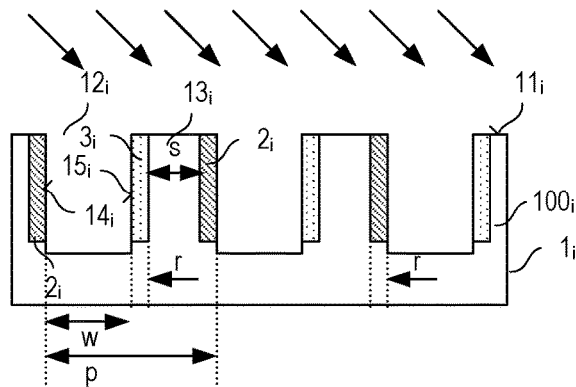
Figure 7E:
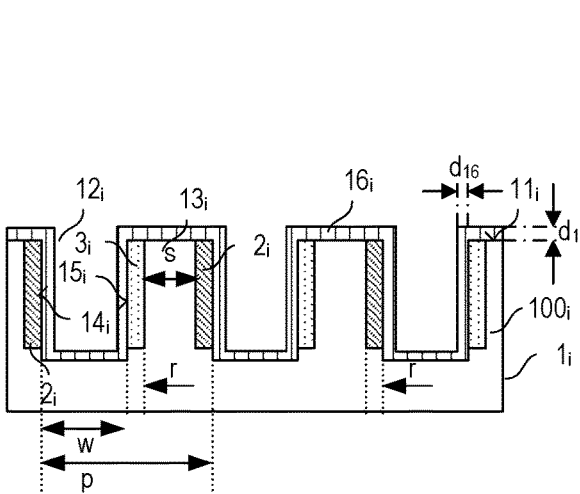

Now referring to FIGS. 7A to 7F, a method for forming a plurality of semiconductor arrangements according to one example is schematically illustrated. According to this example, forming one of the plurality of semiconductor layers $100_i$ essentially corresponds to what has been described with respect to FIGS. 2A-2F above. The steps as illustrated in FIGS. 7A, 7B, 7C and 7D correspond to what has been described with respect to FIGS. 2A, 2B, 2C and 2D above. However, an additional step is performed before forming the semiconductor layer $100_{i+1}$ of a following top semiconductor arrangement. This additional step is schematically illustrated in FIG. 7E. As is schematically illustrated in FIG. 7E, a protective layer $16_i$ is formed on the bottom semiconductor arrangement $1_i$, the protective layer $16_i$ covering mesa regions $13_i$ between the plurality of trenches $12_i$ of the respective semiconductor layer $100_i$, and covering the bottoms, the first sidewalls $14_i$ and the second sidewalls $15_i$ of each of the plurality of trenches $12_i$ that are formed in the respective semiconductor layer $100_i$. The protective layer $16_i$ is configured to seal the surface of the bottom semiconductor arrangement. In this way, the outgassing of dopant atoms during following production steps may be reduced or even prevented, even if such production steps are performed at high temperatures.

The protective layer $16_i$ may have a thickness $d_{16}$ that is significantly smaller than a thickness of the semiconductor layer $100_{i+1}$ of the following top semiconductor arrangement. According to an example, the protective layer $16_i$ has a thickness $d_{16}$ of between 25 nm and 200 nm, between 50 nm and 200 nm, or between 100 nm and 200 nm. The thickness $d_{16}$ of the protective layer $16_i$ may be homogenous. That is, a thickness $d_{16}$ of the protective layer $16_i$ on the mesa regions $13_i$ and on the bottoms of the trenches $12_i$ (thickness in the vertical direction z) may equal a thickness $d_{16}$ of the protective layer $16_i$ on the first sidewalls $14_i$ and the second sidewalls $15_i$ of each of the plurality of trenches $12_i$ (thickness in the first lateral direction x).

Figure 7F:
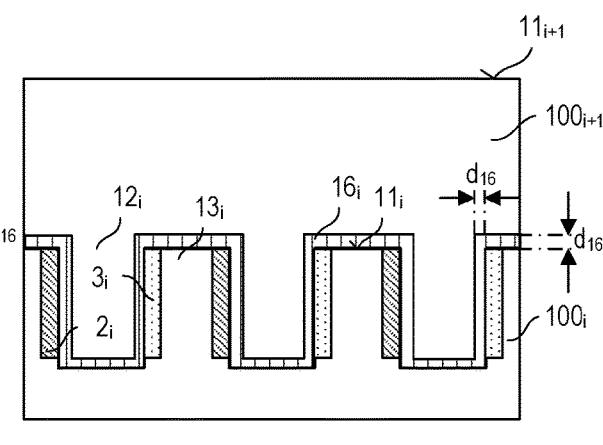
Figure 8A:
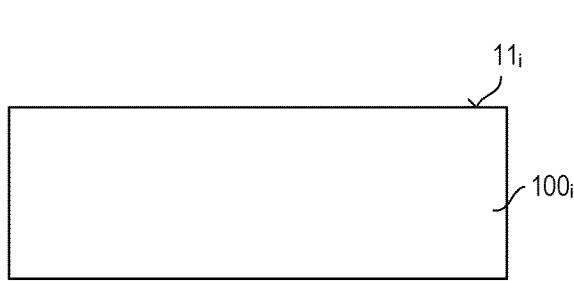
FIGS. 8A-8F illustrate another example of a method for producing a plurality of semiconductor arrangements one above the other, with each semiconductor arrangement including a semiconductor layer, a plurality of trenches in the semiconductor layer, and implanted regions along opposite sidewalls of the trenches.
Figure 8B:
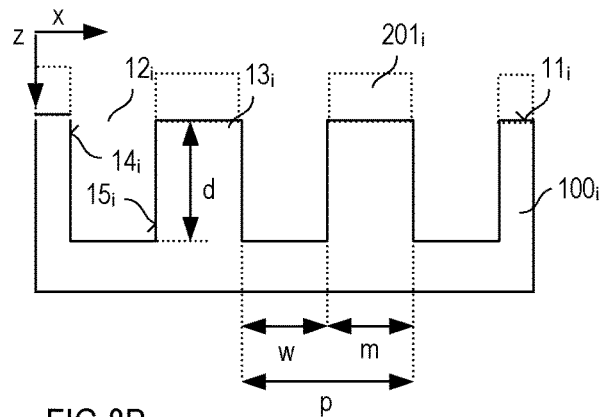
Figure 8C:
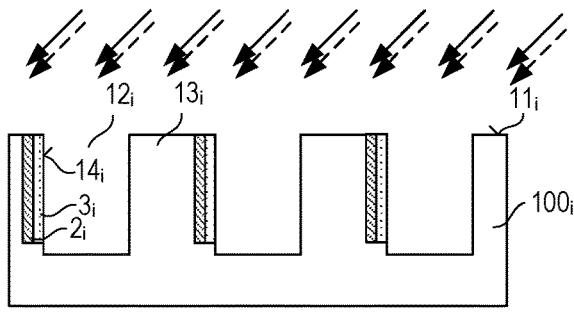
Figure 8D:
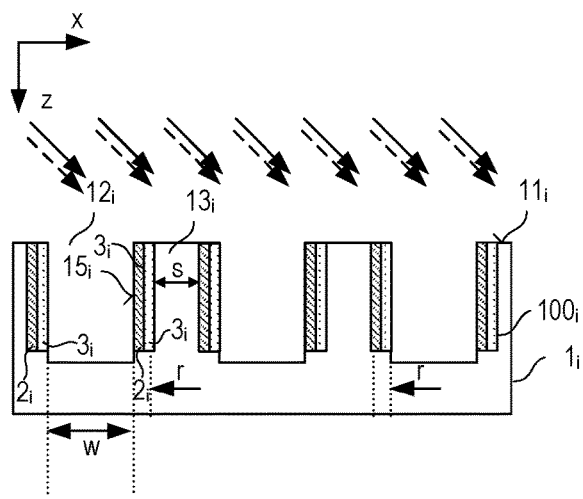
Figure 8E:
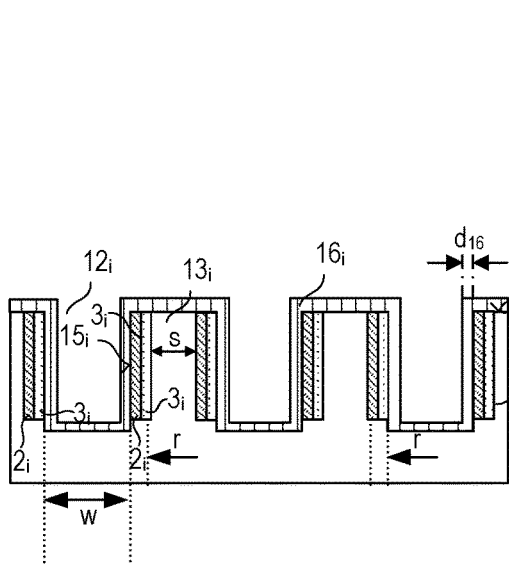
Figure 8F:
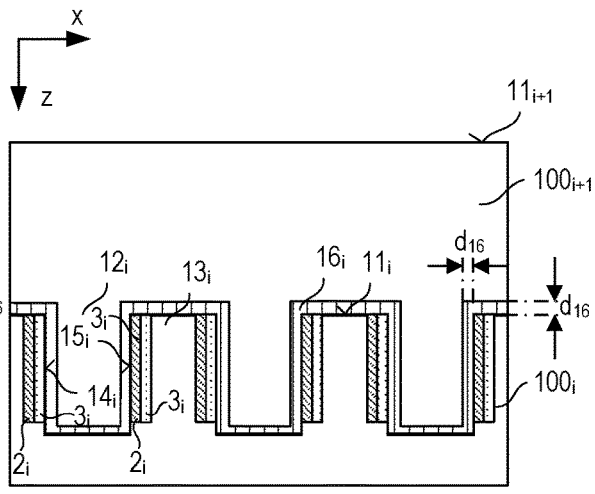

Forming the protective layer $16_i$ may comprise epitaxially growing the protective layer $16_i$ at a temperature of between 650° C. and 1000° C., or between 800° C. and 950° C. That is, the protective layer $16_i$ may comprise the same material as the semiconductor layer $100_{i+1}$ of the following top semiconductor arrangement. The process of forming the protective layer $16_i$ may also essentially equal the process of forming the semiconductor layer $100_{i+1}$ of the following top semiconductor arrangement. However, the protective layer $16_i$ may be formed at temperatures that are significantly lower than the temperatures during the process of forming the semiconductor layer $100_{i+1}$ of the following top semiconductor arrangement. That is, the growth rate of the protective layer $16_i$ may be low as compared to the growth rate of the semiconductor layer $100_{i+1}$ of the following top semiconductor arrangement. At temperatures of below 1000° C., or even below 950° C. the effect of outgassing may be negligible or even entirely prevented. When, after forming the protective layer $16_i$, the semiconductor layer $100_{i+1}$ of the following top semiconductor arrangement is formed at high temperatures, the protective layer $16_i$ seals the surface of the bottom semiconductor arrangement and prevents dopant atoms from leaving the semiconductor body, even if the semiconductor layer $100_{i+1}$ of the following top semiconductor arrangement is formed at temperatures of above 1000° C., or even at temperatures of above 1100° C. The step of forming the semiconductor layer $100_{i+1}$ of the following top semiconductor arrangement is schematically illustrated in FIG. 7F. This step equals the step that has been described with respect to FIG. 2E above.

As has been described above, a preconditioning step may be performed after forming the bottom semiconductor arrangement and before forming the top semiconductor arrangement, wherein the pre-conditioning step comprises removing contaminants, native oxide, or chemically formed oxide formed on the bottom semiconductor arrangement. Such a preconditioning step may comprise removing contaminants, native oxide, or chemically formed oxide formed on the bottom semiconductor arrangement by performing an etching and/or evaporation or sublimation step. The preconditioning step may be performed at a temperature of between 15° C. and 600° C., or between 15° C. and 150° C. The preconditioning step may be highly selective. That is, contaminants, native oxide, or chemically formed oxide are primarily removed during this preconditioning step, while the material (e.g., silicone) of the respective semiconductor arrangement is not removed at all or only marginally. For example, less than 50 nm or even less than 20 nm of the material of the bottom semiconductor arrangement may be removed during the preconditioning step.

In the example illustrated in FIGS. 7A-7F, first type dopant atoms are implanted only into the first sidewalls $14_i$ of the trenches $12_i$ and second type dopant atoms are implanted only into the second sidewalls $15_i$ of the trenches $12_i$. This, however, is only an example. FIGS. 8A-8F show a modification of the method shown in FIGS. 7A-7F. In the method shown in FIGS. 8A-8F, first type dopant atoms are implanted into both the first sidewall 14 (see FIG. 8C) and the second sidewall 15 (see FIG. 8D). The same applies for the second type dopant atoms which are also implanted into both the first sidewall 14 (see FIG. 8C) and the second sidewall 15 (see FIG. 8D). According to one example, the first type dopant atoms may be implanted deeper into the first sidewall 14 than the second type dopant atoms, and the second type dopant atoms may be implanted deeper into the second sidewalls 15 than the first type dopant atoms. In this way, distinctive first type regions 2 and second type regions 3 may be formed in the first and second sidewalls 14, 15. During the annealing process, as has been described above, the implanted dopant atoms may diffuse in the vertical direction z as well as in the first lateral direction x and are electrically activated, thereby forming the drift regions 20 and compensation regions 30 (see, e.g., FIGS. 1 and 6).

According to another example, not specifically illustrated, a method may include implanting both first type dopant atoms and second type dopant atoms into at least one of the first sidewall 14 and the second sidewall of the trenches 12. This may result in a combined first and second type region 23 which includes both dopant atoms of the first type and the second type. The method further includes annealing the semiconductor structure to diffuse the first type dopant atoms and the second type dopant atoms in the semiconductor structure. The first type dopant atoms and the second dopant type atoms may be chosen such that they have different diffusion coefficients so that the annealing process, based on the implanted regions 23 results in adjoining first type semiconductor regions 20 and second type semiconductor regions 30. According to one example, the diffusion constant of one of the first type dopant atoms and the second type dopant atoms is at least 4 times or at least 6 times the diffusion constant of the other one of the first type dopant atoms and the second type dopant atoms. Pairs of dopant atoms that have different diffusion constants are boron (B) and arsenic (As), or boron (B) and antimony (Sb), for example. Boron is a p-type dopant, arsenic and antimony are n-type dopants. In each of these pairs, boron is the dopant with the higher diffusion coefficient. A ratio of the respective diffusion coefficients of boron and arsenic, for example, is between 2:1 and 4:1, depending on the diffusion process. That is, boron diffuses between two and four times as fast as arsenic.

Figure 9:
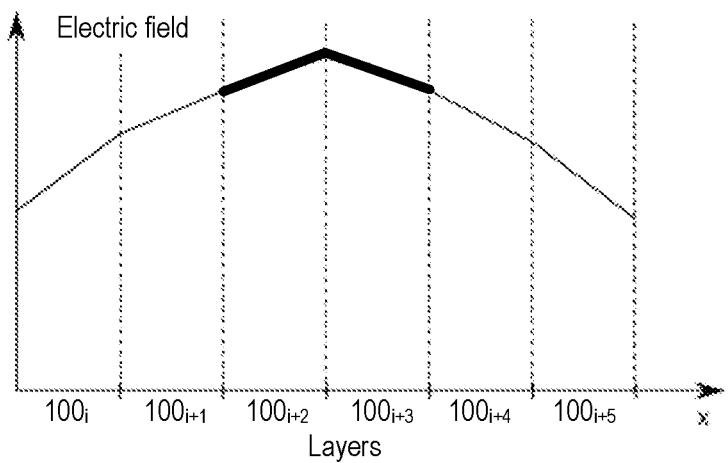
FIG. 9 exemplarily illustrates in a schematic diagram a distribution of an electric field within different layers of a semiconductor arrangement during a blocking state of the device of FIG. 6.

In a semiconductor device that comprises a plurality of individual semiconductor arrangements $1_n$ (see, e.g., FIG. 6), each of the individual semiconductor arrangements $1_n$ may comprise a protective layer $16_i$. This, however, is only an example. According to another example, at least one, but not all of the individual semiconductor arrangements $1_n$ comprise a protective layer $16_i$. This is schematically illustrated in FIG. 9. FIG. 9 schematically illustrates an electric field in a depleted state of a semiconductor device comprising six individual semiconductor arrangements. The electric field is schematically illustrated for the different semiconductor layers $100_i$. As can be seen, the electric field may be lower in those semiconductor layers $100_i$ that are arranged closer to the first surface 101 and the second surface 102

(e.g., semiconductor layers $100_i$, $100_{i+1}$, $100_{i+4}$, $100_{i+5}$). The electric field may be higher in the semiconductor layers $100_i$ that are arranged in the middle of the layer stack or, in other words, in those semiconductor layers $100_i$ that are arranged furthest from both the first surface 101 and the second surface 102 (e.g., semiconductor layers $100_{i+2}$ and $100_{i+3}$). The electric field in these middle layers $100_{i+2}$ and $100_{i+3}$ is illustrated in a bold line in FIG. 9, indicating that the middle semiconductor layers $100_{i+2}$ and $100_{i+3}$ each comprise a protective layer $16_{i+2}$, $16_{i+3}$. The remaining semiconductor layers $100_i$, $100_{i+1}$, $100_{i+4}$, $100_{i+5}$ may not comprise a protective layer 16.

For some applications, it may be sufficient that only such middle semiconductor arrangements each comprise a protective layer 16. The protective layer 16, however, may be omitted for the other semiconductor arrangements. That is, the effect of outgassing may be accepted or tolerated in some of the semiconductor arrangements. The semiconductor layers (middle layers $100_{i+2}$ and $100_{i+3}$ in FIG. 9) in which the electric field in the depleted state of the semiconductor device is the highest generally have the highest impact on the overall breakdown voltage of the semiconductor device. The impact on the breakdown voltage of those semiconductor arrangements in which the electric field is less, is generally lower.

Figure 10:
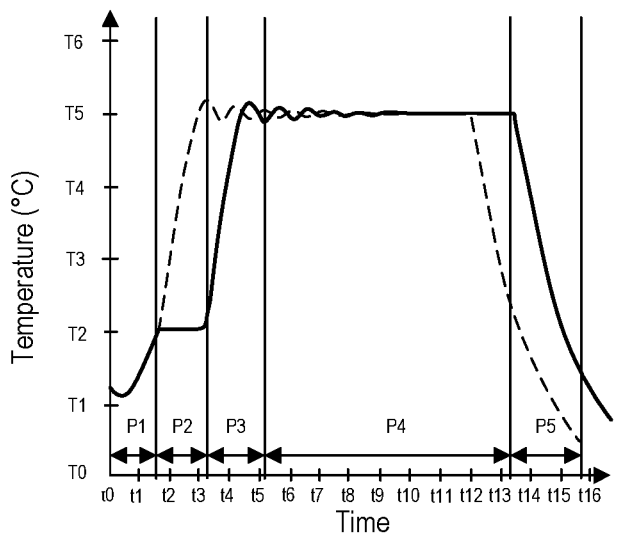
FIG. 10 schematically illustrates the course of a temperature that a semiconductor body is exposed to during the different steps of the methods of FIG. 2 (dashed line) and FIGS. 7A-7F and 8A-8F (continuous line)

Now referring to FIG. 10, a process sequence for forming a semiconductor arrangement including a protective layer $16_i$ (solid line) is compared to a process sequence for forming a semiconductor arrangement without a protective layer $16_i$ (dashed line). The preconditioning step P1 may be the same for both process sequences. When forming a semiconductor arrangement without a protective layer $16_i$, however, the temperature may ramp up immediately after the preconditioning step P1. The semiconductor layer $100_{i+1}$ of a following semiconductor arrangement may then be formed at a high temperature T5 of, e.g., 1100° C.

When forming a protective layer $16i$, the formation of the protective layer $16_i$ P2 may directly follow the preconditioning step P1. That is, forming the semiconductor layer $100_i$ of a following semiconductor arrangement may be slightly delayed. The step P2 of forming the protective layer $16_i$ may be performed at a temperature T2 which is lower than the high temperature T5 during a time interval t2-t3 that may have a length of, e.g., 20 to 120 seconds, or 20 to 40 seconds. Only after forming the protective layer $16_i$ may the temperature be ramped up to a higher temperature T5 (step P3) in order to form the semiconductor layer $100_{i+1}$ of a following semiconductor arrangement (step P4). That is, the time that is required to form a semiconductor arrangement with protective layer $16_i$ is somewhat longer than the time that is required to form a semiconductor arrangement without protective layer $16_i$. In a last step P5, after forming the semiconductor layer $100_{i+1}$ of a following semiconductor arrangement, the temperature may subsequently be decreased.

Figure 11:
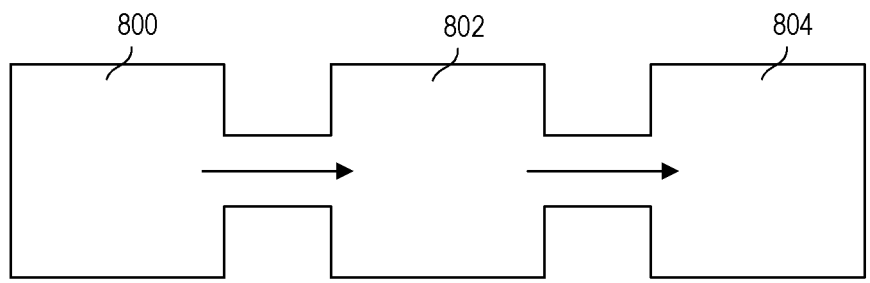
FIG. 11 schematically illustrates different process chambers for performing a method for producing a plurality of semiconductor arrangements one above the other.

Now referring to FIG. 11, the different process steps may be performed in different process chambers. For example, the preconditioning step P1 may be performed in a first process chamber 800. This process chamber 800 may be a plasma chamber, for example, if the preconditioning step comprises a low temperature plasma step (oxide and/or contamination removal step). The protective layer $16_i$ may subsequently be formed in an epitaxy chamber 802 directly adjoining the plasma chamber 800. In this way, the pre-conditioned bottom semiconductor arrangement does not come into contact with oxygen between the preconditioning step and the step of forming the protective layer $16_i$. In this way, the formation of native oxide, chemically formed oxide or other contaminants between the preconditioning step and the step of forming the protective layer $16_i$ may be reduced or even prevented. Forming the semiconductor layer $100_{i+1}$ of a following semiconductor arrangement may either be performed in the epitaxy chamber 802 in which the protective layer $16_i$ is formed. In this case, a temperature in the epitaxy chamber 802 is increased after forming the protective layer $16_i$. According to another example, however, it is also possible that the step of forming the semiconductor layer $100_{i+1}$ of a following semiconductor arrangement is performed in a separate second epitaxy chamber 804. The two epitaxy chambers 802, 804 may also directly adjoin each other such that the semiconductor body may be transferred directly from one epitaxy chamber 802 to the other 804 without coming into contact with oxygen.

Figure 12A:
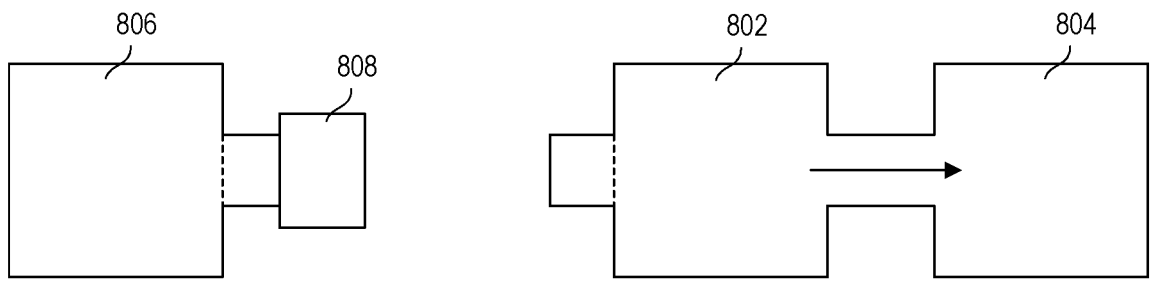
FIGS. 12A-12C schematically illustrate another example of different process chambers for performing another method for producing a plurality of semiconductor arrangements one above the other.

According to another example, the preconditioning step may comprise a wet etching process. That is, the preconditioning step may comprise removing contaminants, native oxide, or chemically formed oxide formed on the bottom semiconductor arrangement by performing a wet chemical etching process. Now referring to FIGS. 12A-12C, the different process steps, including a preceding wet etching step, may be performed in different process chambers. For example, the preconditioning step in this example may be performed in a wet etching chamber 806. This wet etching chamber 806 may be arranged distant from the epitaxy chamber 802. That is, the protective layer $16_i$ may subsequently be formed in an epitaxy chamber 802 that does not directly adjoin the wet etching chamber 806. In order to prevent the pre-conditioned bottom semiconductor arrangement from coming into contact with oxygen between the preconditioning step and the step of forming the protective layer $16_i$, the semiconductor body may be loaded into a transportation box 808. This transportation box 808 (which may also be referred to as FOUP "Front Opening Unified Pod") is an enclosure or box that allows to transport wafers or semiconductor bodies in a controlled environment between different processing chambers. The transportation box 808 may dock to an opening or airlock of the wet etching chamber 806. The semiconductor body is loaded from the wet etching chamber 806 into the transportation box 808 without coming into contact with oxygen. This is schematically illustrated in FIG. 12A. The transportation box 808 may then be tightly sealed. According to one example, a clean room atmosphere or a stable nitrogen (N2) atmosphere is generated inside the transportation box 808. According to one example, a plurality of wafers or semiconductor bodies may be transported in a single transportation box 808.

Figure 12B:
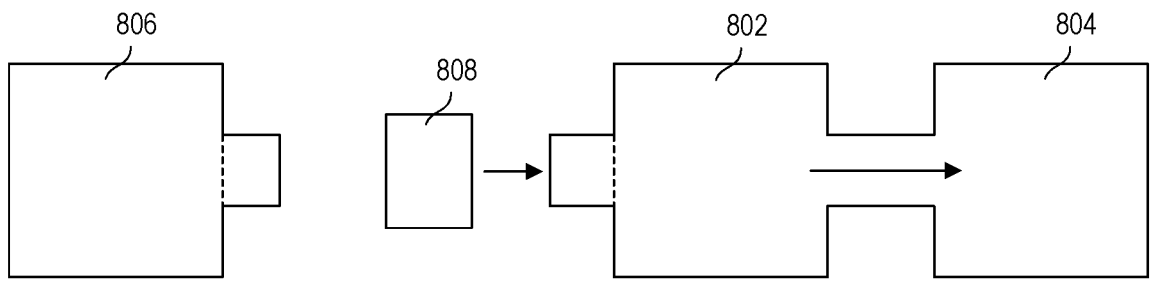
Figure 12C:
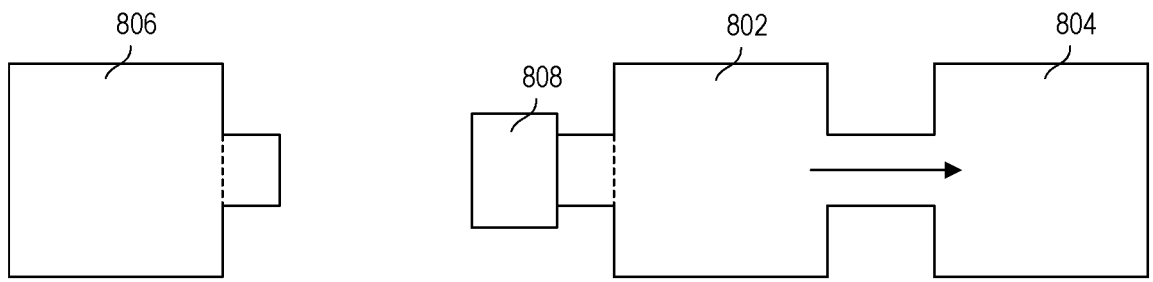

The sealed transportation box 808 is then transported to the epitaxy chamber 802 (see FIG. 12B). Next, the transportation box 808 may dock to an opening or airlock of the epitaxy chamber 802 and the semiconductor bodies may be unloaded from the transportation box 808 and into the epitaxy chamber 802 for further processing without coming into contact with oxygen. This is schematically illustrated in FIG. 12C. In this way, the pre-conditioned bottom semiconductor arrangement does not come into contact with oxygen at any time between the preconditioning step and the step of forming the protective layer $16_i$. Thereby, the formation of native oxide, chemically formed oxide or other contaminants between the preconditioning step and the step of forming the protective layer $16_i$ may be reduced or even prevented. As has been described above with respect to FIG. 11, forming the semiconductor layer $100_{i+1}$ of a following semiconductor arrangement may either be performed in the epitaxy chamber 802 in which the protective layer $16_i$ is formed. In this case, a temperature in the epitaxy chamber 802 is increased after forming the protective layer $16_i$. According to another example, however, it is also possible that the step of forming the semiconductor layer $100_{i+1}$ of a following semiconductor arrangement is performed in a separate second epitaxy chamber 804. The two epitaxy chambers 802, 804, as has been described with respect to FIG. 11 above, may directly adjoin each other such that the semiconductor body may be transferred directly from one epitaxy chamber 802 to the other 804 without coming into contact with oxygen.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a plurality of semiconductor arrangements one above the other, wherein forming each of the plurality of semiconductor arrangements comprises:
   forming a semiconductor layer;
   forming a plurality of trenches in a first surface of the semiconductor layer; and
   implanting dopant atoms of at least one of a first type and a second type into at least one of a first sidewall and a second sidewall of each of the plurality of trenches, and wherein forming of at least one of the plurality of semiconductor arrangements further comprises:
   forming a protective layer covering mesa regions between the plurality of trenches of the respective semiconductor layer, and covering a bottom, the first sidewall and the second sidewall of each of the plurality of trenches that are formed in the respective semiconductor layer, wherein the plurality of semiconductor arrangements comprises at least four semiconductor arrangements, and wherein forming of at least one but not all of the semiconductor arrangements comprises forming the protective layer.

2. The method of claim 1, wherein the protective layer has a thickness of between 25 nm and 200 nm, between 50 nm and 200 nm, or between 100 nm and 200 nm.

3. The method of claim 1, wherein forming the protective layer comprises epitaxially growing the protective layer at a temperature of between 650° C. and 1000° C., or between 800° C. and 950° C.

4. The method of claim 1, wherein forming the semiconductor layer comprises epitaxially growing the semiconductor layer at a temperature of 1000° C. or more, or at a temperature of 1100° C. or more.

5. The method of claim 1, wherein the plurality of semiconductor arrangements comprises at least one pair of semiconductor arrangements with a bottom semiconductor arrangement and a top semiconductor arrangement adjoining the bottom semiconductor arrangement, and wherein forming the semiconductor layer of the top semiconductor arrangement comprises forming the semiconductor layer in the plurality of trenches and on top of mesa regions between the plurality of trenches of the semiconductor layer of the bottom semiconductor arrangement.

6. The method of claim 5, wherein forming the bottom semiconductor arrangement comprises forming a protective layer, and wherein forming the semiconductor layer of the top semiconductor arrangement comprises forming the semiconductor layer such that the protective layer is arranged between the bottom semiconductor arrangement and the semiconductor layer of the top semiconductor arrangement.

7. The method of claim 5, further comprising:
   performing a pre-conditioning step after forming the bottom semiconductor arrangement and before forming the top semiconductor arrangement, wherein the pre-conditioning step comprises removing contaminants, native oxide, or chemically formed oxide formed on the bottom semiconductor arrangement.

8. The method of claim 7, wherein removing contaminants, native oxide, or chemically formed oxide formed on the bottom semiconductor arrangement comprises performing an etching or removal step in a plasma chamber.

9. The method of claim 7, wherein the pre-conditioning step is performed at a temperature of between 15° C. and 600° C.

10. The method of claim 8, wherein forming the protective layer comprises forming the protective layer in an epitaxy chamber directly adjoining the plasma chamber such that the pre-conditioned bottom semiconductor arrangement does not come into contact with oxygen between the pre-conditioning step and forming the protective layer.

11. The method of claim 1, wherein each of the plurality of trenches is arranged in one of at least two sections, and wherein when forming a semiconductor arrangement without a protective layer, an implantation dose of at least one of the first type dopant atoms and the second type dopant atoms for each of the at least two sections differs from the implantation dose of the corresponding type of dopant atoms of at least one other section of the at least two sections.

12. The method of claim 1, wherein implanting the dopant atoms comprises:
   implanting dopant atoms of the first type into the first sidewall; and
   implanting dopant atoms of the second type into the second sidewall.

13. The method of claim 1, wherein implanting the dopant atoms comprises:
   implanting dopant atoms of both the first type and the second type into at least one of the first sidewall and the second sidewall.

14. The method of claim 1, further comprising:
   annealing the semiconductor body to diffuse the dopant atoms.

* * * * *